United States Patent
Ryu et al.

(10) Patent No.: US 12,363,653 B2
(45) Date of Patent: Jul. 15, 2025

(54) SIDELINK SLOTS WITH MULTIPLE AUTOMATIC GAIN CONTROL SYMBOLS

(71) Applicant: QUALCOMM Incorporated, San Diego, CA (US)

(72) Inventors: Jung Ho Ryu, Fort Lee, NJ (US); Sony Akkarakaran, Poway, CA (US); Tao Luo, San Diego, CA (US); Junyi Li, Fairless Hills, PA (US); Peter Gaal, San Diego, CA (US); Juan Montojo, San Diego, CA (US); Xiaoxia Zhang, San Diego, CA (US); Xiaojie Wang, Hillsborough, NJ (US); Hua Wang, Basking Ridge, NJ (US); Wooseok Nam, San Diego, CA (US); Yan Zhou, San Diego, CA (US); Piyush Gupta, Bridgewater, NJ (US); Kobi Ravid, Closter, NJ (US); Lik Hang Silas Fong, Bridgewater, NJ (US); Chih-Hao Liu, San Diego, CA (US); Jing Sun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 332 days.

(21) Appl. No.: 17/647,722

(22) Filed: Jan. 11, 2022

(65) Prior Publication Data

US 2023/0224830 A1    Jul. 13, 2023

(51) Int. Cl.
| | |
|---|---|
| *H04W 52/52* | (2009.01) |
| *H04W 72/02* | (2009.01) |
| *H04W 72/0446* | (2023.01) |

(52) U.S. Cl.
CPC .......... *H04W 52/52* (2013.01); *H04W 72/02* (2013.01); *H04W 72/0446* (2013.01)

(58) Field of Classification Search
CPC ................ H04W 52/52; H04W 72/02; H04W 72/0446; H04B 17/345; H03G 3/002; H03G 3/3042; H04L 5/0048
See application file for complete search history.

(56) References Cited

U.S. PATENT DOCUMENTS

| | | |
|---|---|---|
| 9,270,312 B2 | 2/2016 | Park et al. |
| 10,917,274 B2 | 2/2021 | Werner et al. |
| (Continued) | | |

FOREIGN PATENT DOCUMENTS

| | | | | |
|---|---|---|---|---|
| CN | 111181710 A | * | 5/2020 | ........... H04L 5/0008 |
| CN | 113632582 A | * | 11/2021 | ........ H04W 72/0446 |
| (Continued) | | | | |

OTHER PUBLICATIONS

International Search Report and Written Opinion—PCT/US2023/060275—ISA/EPO—May 8, 2023.
(Continued)

*Primary Examiner* — Dinh Nguyen
(74) *Attorney, Agent, or Firm* — Dinsmore & Shohl LLP

(57) ABSTRACT

Certain aspects of the present disclosure provide techniques for configuring sidelink slots with multiple automatic gain control symbols. One aspect provides a method for wireless communication by a user equipment, including enabling a slot configuration comprising at least two symbols configured for use by a receiver for automatic gain control in preconfigured symbol locations within a slot, and transmitting the at least two symbols while transmitting symbols within the slot.

28 Claims, 11 Drawing Sheets

(56) References Cited

U.S. PATENT DOCUMENTS

| | | | |
|---|---|---|---|
| 11,616,562 B1* | 3/2023 | Pratas | H04B 7/0621 375/267 |
| 2009/0268678 A1 | 10/2009 | Huo et al. | |
| 2020/0145079 A1 | 5/2020 | Marinier et al. | |
| 2020/0313706 A1* | 10/2020 | Gulati | H04W 72/0446 |
| 2021/0022139 A1* | 1/2021 | Shin | H04W 28/0289 |
| 2021/0219268 A1 | 7/2021 | Li et al. | |
| 2021/0314933 A1 | 10/2021 | Zhang et al. | |
| 2021/0360590 A1* | 11/2021 | Lee | H04W 72/0453 |
| 2022/0104126 A1 | 3/2022 | Lee et al. | |
| 2022/0201629 A1 | 6/2022 | Ko et al. | |
| 2023/0224829 A1 | 7/2023 | Ryu et al. | |
| 2023/0224831 A1 | 7/2023 | Ryu et al. | |
| 2023/0262618 A1 | 8/2023 | Ryu et al. | |
| 2024/0064664 A1 | 2/2024 | Ryu et al. | |
| 2024/0073947 A1 | 2/2024 | Babaei | |
| 2024/0137975 A1 | 4/2024 | Ryu et al. | |

FOREIGN PATENT DOCUMENTS

| | | |
|---|---|---|
| EP | 3413638 A1 | 12/2018 |
| EP | 3910969 A1 | 11/2021 |
| WO | 2020142999 A1 | 7/2020 |
| WO | 2021034572 A1 | 2/2021 |

OTHER PUBLICATIONS

3GPP TR 37.985 V17.0.0 (Dec. 2021) 3rd Generation Partnership Project: "Technical Specification Group Radio Access Network: Overall description of Radio Access Network (RAN) aspects for Vehicle-to-everything (V2X) based on LTE and NR (Release 17)", 3rd Generation Partnership Project, Mobile Competence Centre, 650, Route Des Lucioles, F-06921 Sophia-Antipolis Cedex, France, No. V17.0.0, Jan. 5, 2022, pp. 1-37, XP052118397.

Garcia M.H.C., et al., "A Tutorial on 5G NR V2X Communications", in IEEE Communications Surveys and Tutorials, vol. 23, No. 3, Third Quarter, Arxiv.Org, Cornell University Library, 201 Olin Library Cornell University, Ithaca, NY 14853, Feb. 8, 2021, XP081877162, 55 Pages, p. 18-p. 21, figures 8, 10, 14, sections V.A.1), V.B, V.B.5), V.C.6), VI.B, VII.C, VIII.B, pp. 1972-2026.

Harounabadi M., et al., "V2X in 3GPP Standardization: NR Sidelink in Rel-16 and Beyond", arxiv.org, Cornell University Library, 201 Olin Library Cornell University Ithaca, NY, 14853, Apr. 22, 2021, pp. 1-10.

Huawei., et al., "UL Power Control for Short TTI", 3GPP TSG RAN WG1 Meeting #88, R1-1701738, 3rd Generation Partnership Project, Mobile Competence Centre, 650, Route Des Lucioles, F-06921 Sophia-Antipolis Cedex, France, vol. RAN WG1, No. Athens, Greece, Feb. 13, 2017-Feb. 17, 2017, Feb. 6, 2017, 4 Pages.

Intel Corporation: "Considerations on Support of Short TTI for LTE V2V Sidelink Communication", 3GPP TSG RAN WG1 Meeting #89, R1-1707307, 3rd Generation Partnership Project, Mobile Competence Centre, 650, Route Des Lucioles, F-06921 Sophia-Antipolis Cedex, France, vol. RAN WG1, No. Hangzhou, May 15, 2017-May 19, 2017, May 14, 2017, pp. 1-8, XP051272520.

Intel Corporation: "Synchronization Framework for NR V2X Sidelink Communication", 3GPP TSG RAN WG1 Meeting #95, R1-1812490, 3rd Generation Partnership Project, Mobile Competence Centre, 650, Route Des Lucioles, F-06921 Sophia-Antipolis Cedex, France, vol. RAN WG1, No. Spokane, USA, Nov. 12, 2018-Nov. 16, 2018, Nov. 11, 2018, pp. 1-13, XP051554434.

Samsung: "Summary#2 of discussion on PSSCH DMRS patterns and for the number of PSSCH symbols", 3GPP TSG RAN1#99 R1-1913576, 3rd Generation Partnership Project, Mobile Competence Centre, 650, Route Des Lucioles, F-06921 Sophia-Antipolis Cedex, France, vol. RAN WG1, No. Reno, USA, Nov. 18, 2019-Nov. 22, 2019, Nov. 25, 2019, 19 Pages, XP051830853.

* cited by examiner

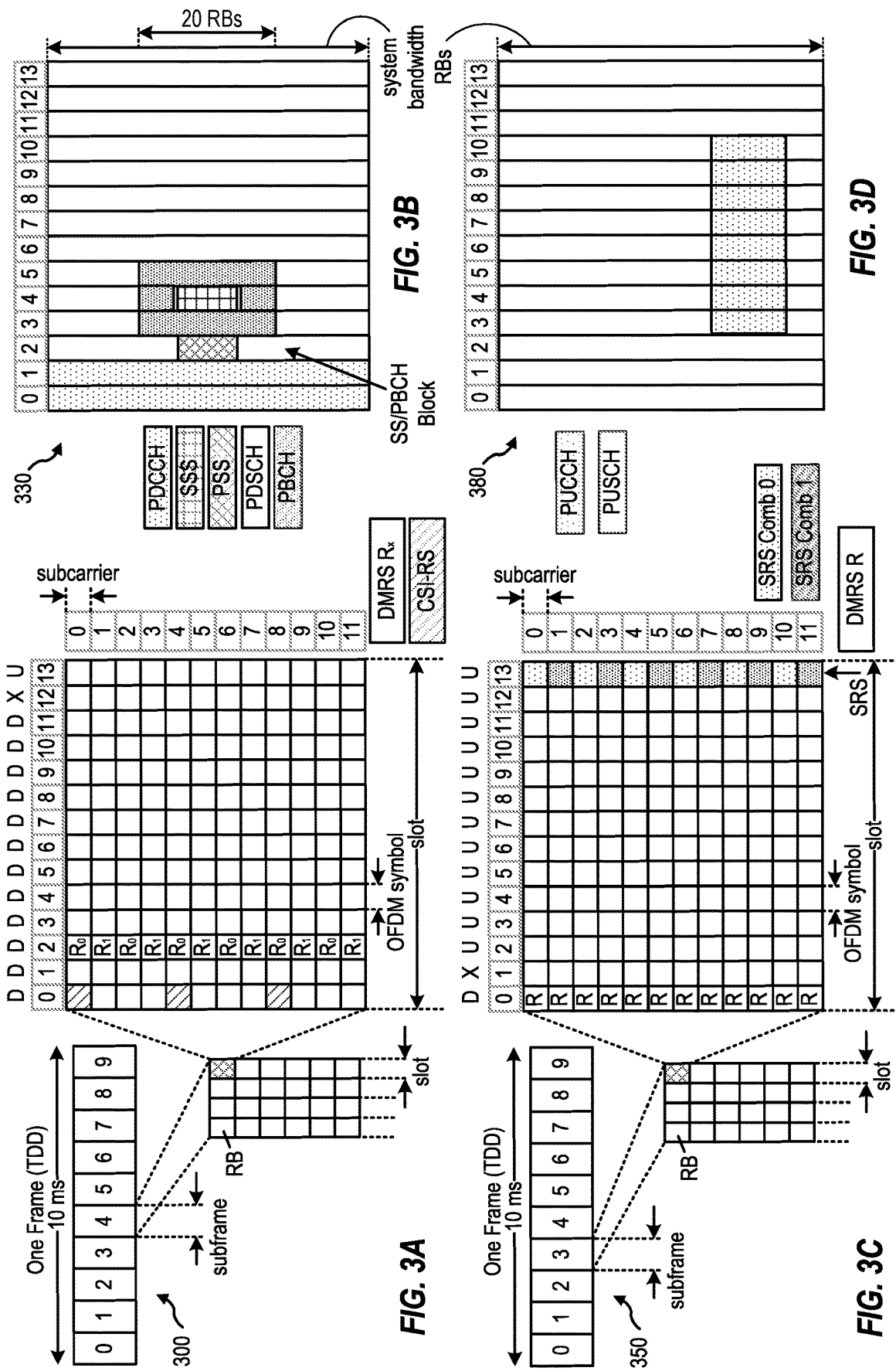

SIDELINK SLOTS WITH MULTIPLE AUTOMATIC GAIN CONTROL SYMBOLS

INTRODUCTION

Aspects of the present disclosure relate to wireless communications, and more particularly, to techniques for configuring sidelink slots with multiple automatic gain control symbols.

Wireless communication systems are widely deployed to provide various telecommunication services such as telephony, video, data, messaging, broadcasts, or other similar types of services. These wireless communication systems may employ multiple-access technologies capable of supporting communication with multiple users by sharing available system resources with those users (e.g., bandwidth, transmit power, or other resources). Multiple-access technologies can rely on any of code division, time division, frequency division orthogonal frequency division, single-carrier frequency division, or time division synchronous code division, to name a few. These and other multiple access technologies have been adopted in various telecommunication standards to provide a common protocol that enables different wireless devices to communicate on a municipal, national, regional, and even global level.

Although wireless communication systems have made great technological advancements over many years, challenges still exist. For example, complex and dynamic environments can still attenuate or block signals between wireless transmitters and wireless receivers, undermining various established wireless channel measuring and reporting mechanisms, which are used to manage and optimize the use of finite wireless channel resources. Consequently, there exists a need for further improvements in wireless communications systems to overcome various challenges.

SUMMARY

One aspect provides a method for wireless communication by a user equipment, including enabling a slot configuration comprising at least two symbols configured for use by a receiver for automatic gain control in preconfigured symbol locations within a slot; and transmitting the at least two symbols while transmitting symbols within the slot.

One aspect provides a method for wireless communication by a user equipment, including enabling a slot configuration comprising at least two symbols configured for use for automatic gain control in preconfigured symbol locations within a slot; receiving the at least two symbols while receiving symbols within the slot; and adjusting an automatic gain control setting after receiving each symbol of the at least two symbols configured for use for automatic gain control.

Another aspect provides a method for wireless communication by a base station, including transmitting a resource pool configuration to a user equipment, wherein the resource pool configuration comprises one or more slot configurations comprising at least two symbols configured for use by a receiver for automatic gain control in preconfigured symbol locations within a slot Other aspects provide: an apparatus operable, configured, or otherwise adapted to perform the aforementioned methods as well as those described elsewhere herein; a non-transitory, computer-readable media comprising instructions that, when executed by one or more processors of an apparatus, cause the apparatus to perform the aforementioned methods as well as those described elsewhere herein; a computer program product embodied on a computer-readable storage medium comprising code for performing the aforementioned methods as well as those described elsewhere herein; and an apparatus comprising means for performing the aforementioned methods as well as those described elsewhere herein. By way of example, an apparatus may comprise a processing system, a device with a processing system, or processing systems cooperating over one or more networks.

The following description and the appended figures set forth certain features for purposes of illustration.

BRIEF DESCRIPTION OF THE DRAWINGS

The appended figures depict certain features of the various aspects described herein and are not to be considered limiting of the scope of this disclosure.

FIGS. 3A, 3B, 3C, and 3D depict various aspects of data structures for a wireless communication network.

DETAILED DESCRIPTION

Aspects of the present disclosure provide apparatuses, methods, processing systems, and computer-readable mediums for configuring sidelink slots with multiple automatic gain control symbols.

In wireless communication systems, automatic gain control (AGC) algorithms are used by user equipments receiving wireless signals in order to regulate the signal strength at the input of signal processing elements, such as analog to digital converters (ADCs). This regulation helps to ensure that the required signal-to-noise ratio (SNR) for proper decoding of the received wireless signal is met. For example, if a received signal strength at an antenna is low, an AGC algorithm may boost the receiver gain in order to bring the signal level to an acceptable (SNR) and to avoid ADC "underflow". Likewise, if the received signal strength is high, the AGC algorithm may attenuate the receiver gain in order to avoid signal clipping (e.g., ADC "overflow") and nonlinear degradations that may deteriorate the SNR. In other words, AGC algorithms help to ensure that received signals lie within operating ranges of a user equipment's receiving hardware (e.g. ADCs).

Generally, a slot format for wireless communication may include a symbol that is used for AGC. For example, a first symbol in a slot may be designated as an "AGC symbol" in order that a receiving user equipment knows to measure that symbol and provide the received signal strength for that designated symbol to an AGC algorithm (or module). Similarly, a first symbol in a mini-slot may be designed as an AGC symbol. Occasionally, a user equipment (UE) receiving a first communication may also receive a second communication, not intended for it, as interference, which can cause signal reception issues due to a no longer valid gain setting. For example, a mini-slot transmission received as interference in the middle of a slot based transmission can cause ADC overflow, because the received power level increases while the gain level remains the same.

Aspects described herein overcome these technical limitations of existing AGC procedures by using additional AGC symbols within a transmission slot. Using additional symbols for AGC beneficially allows the receiving (Rx) UE to (re) adjust AGC gain during a slot (e.g., intra-slot AGC adjustment). In some aspects, the additional AGC symbol may be aligned with the start of a mini-slot so that the UE receiving the mini-slot as interference can adjust its AGC during the slot and maintain a proper gain. By ensuring the AGC remains valid during a slot, the signal-to-noise ratio (SNR) is beneficially maintained at a user equipment and data loss is beneficially avoided. Thus, despite using more than one symbol for AGC purposes, overall efficiency in spectrum use and reduced latency may still be achieved by avoiding the need to retransmit data that may otherwise be corrupted by a sub-optimal AGC setting.

Introduction to Wireless Communication Networks

Figure 1:
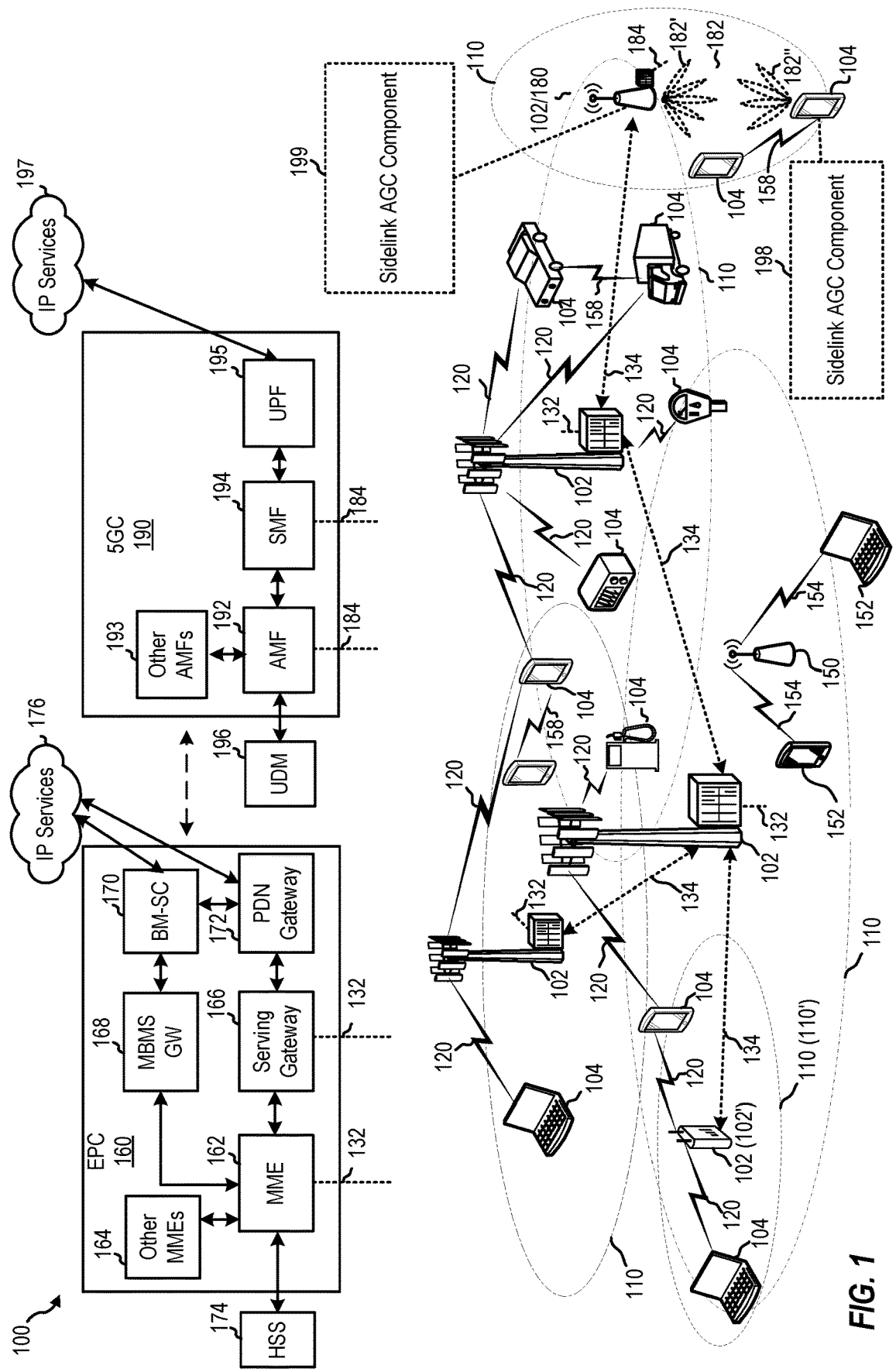
FIG. 1 is a block diagram conceptually illustrating an example wireless communication network.

FIG. 1 depicts an example of a wireless communication network 100, in which aspects described herein may be implemented.

Generally, wireless communication network 100 includes base stations (BSs) 102, user equipments (UEs) 104, one or more core networks, such as an Evolved Packet Core (EPC) 160 and 5G Core (5GC) network 190, which interoperate to provide wireless communications services.

BSs 102 may provide an access point to the EPC 160 and/or 5GC 190 for a UE 104, and may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, delivery of warning messages, among other functions. Base stations may include and/or be referred to as a gNB, NodeB, eNB, ng-eNB (e.g., an eNB that has been enhanced to provide connection to both EPC 160 and 5GC 190), an access point, a base transceiver station, a radio base station, a radio transceiver, or a transceiver function, or a transmission reception point in various contexts.

A base station, such as BS 102, may include components that are located at a single physical location or components located at various physical locations. In examples in which the base station includes components that are located at various physical locations, the various components may each perform various functions such that, collectively, the various components achieve functionality that is similar to a base station that is located at a single physical location. As such, a base station may equivalently refer to a standalone base station or a base station including components that are located at various physical locations or virtualized locations. In some implementations, a base station including components that are located at various physical locations may be referred to as or may be associated with a disaggregated radio access network (RAN) architecture, such as an Open RAN (O-RAN) or Virtualized RAN (VRAN) architecture. In some implementations, such components of a base station may include or refer to one or more of a central unit (CU), a distributed unit (DU), or a radio unit (RU).

BSs 102 wirelessly communicate with UEs 104 via communications links 120. Each of BSs 102 may provide communication coverage for a respective geographic coverage area 110, which may overlap in some cases. For example, small cell 102' (e.g., a low-power base station) may have a coverage area 110' that overlaps the coverage area 110 of one or more macrocells (e.g., high-power base stations).

The communication links 120 between BSs 102 and UEs 104 may include uplink (UL) (also referred to as reverse link) transmissions from a UE 104 to a BS 102 and/or downlink (DL) (also referred to as forward link) transmissions from a BS 102 to a UE 104. The communication links 120 may use multiple-input and multiple-output (MIMO) antenna technology, including spatial multiplexing, beamforming, and/or transmit diversity in various aspects.

Examples of UEs 104 include a cellular phone, a smart phone, a session initiation protocol (SIP) phone, a laptop, a personal digital assistant (PDA), a satellite radio, a global positioning system, a multimedia device, a video device, a digital audio player, a camera, a game console, a tablet, a smart device, a wearable device, a vehicle, an electric meter, a gas pump, a large or small kitchen appliance, a healthcare device, an implant, a sensor/actuator, a display, or other similar devices. Some of UEs 104 may be internet of things (IoT) devices (e.g., parking meter, gas pump, toaster, vehicles, heart monitor, or other IoT devices), always on (AON) devices, or edge processing devices. UEs 104 may also be referred to more generally as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, or a client.

Communications using higher frequency bands may have higher path loss and a shorter range compared to lower frequency communications. Accordingly, certain base stations (e.g., 180 in FIG. 1) may utilize beamforming 182 with a UE 104 to improve path loss and range. For example, base station 180 and the UE 104 may each include a plurality of antennas, such as antenna elements, antenna panels, and/or antenna arrays to facilitate the beamforming.

In some cases, base station 180 may transmit a beamformed signal to UE 104 in one or more transmit directions 182'. UE 104 may receive the beamformed signal from the base station 180 in one or more receive directions 182". UE 104 may also transmit a beamformed signal to the base station 180 in one or more transmit directions 182". Base station 180 may also receive the beamformed signal from UE 104 in one or more receive directions 182'. Base station 180 and UE 104 may then perform beam training to determine the best receive and transmit directions for each of base station 180 and UE 104. Notably, the transmit and receive directions for base station 180 may or may not be the same. Similarly, the transmit and receive directions for UE 104 may or may not be the same.

Wireless communication network 100 includes sidelink automatic gain control (AGC) component 199, which may configure one or more slot configurations for use by a receiver for automatic gain control. Wireless communication network 100 further includes sidelink AGC component 198, which may be used to configure ACG adjusts automatic gain control settings based on enabled slot configurations.

Figure 2:
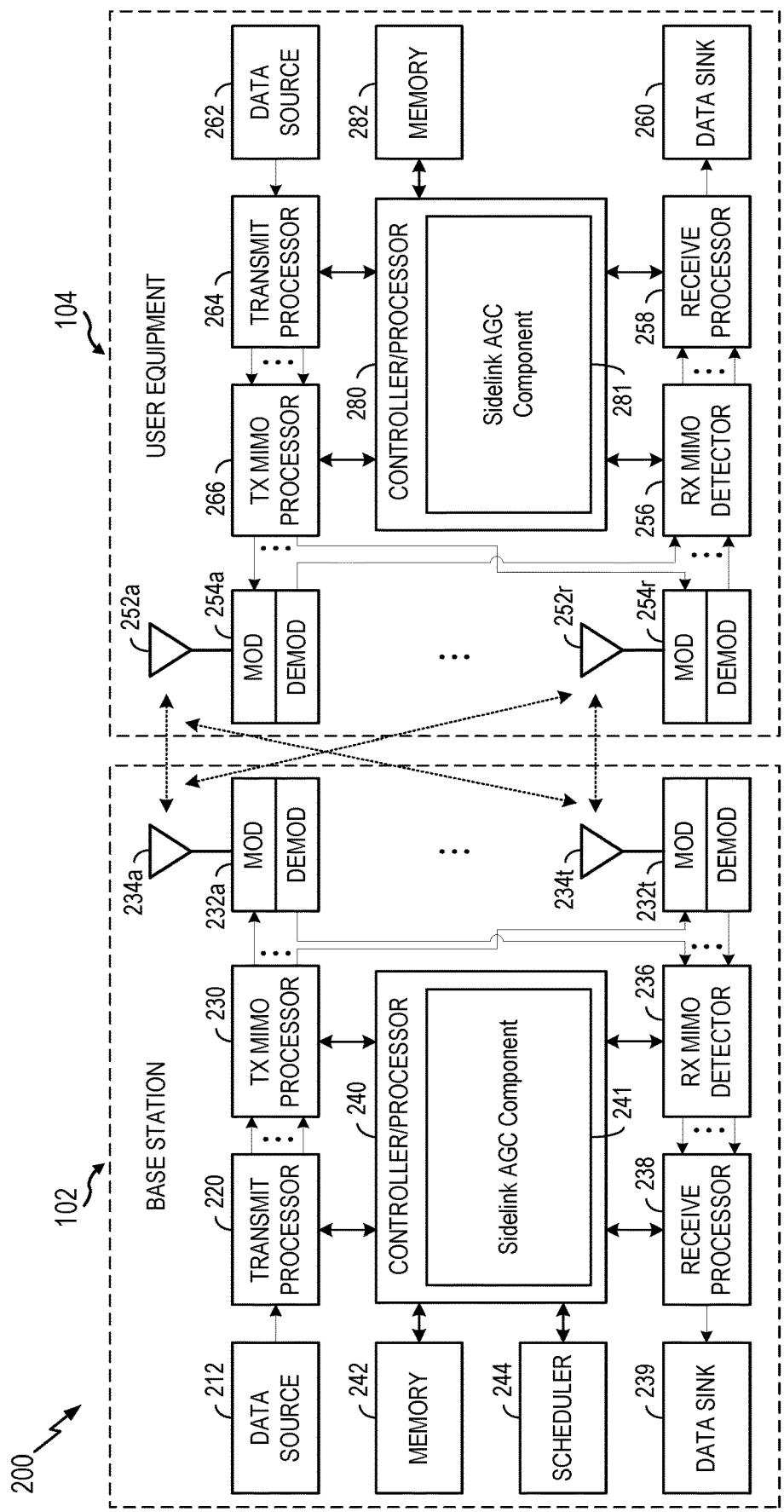
FIG. 2 is a block diagram conceptually illustrating aspects of an example of a base station and user equipment.

FIG. 2 depicts aspects of an example BS 102 and a UE 104. Generally, BS 102 includes various processors (e.g., 220, 230, 238, and 240), antennas 234a-t (collectively 234), transceivers 232a-t (collectively 232), which include modulators and demodulators, and other aspects, which enable wireless transmission of data (e.g., data source 212) and wireless reception of data (e.g., data sink 239). For example, BS 102 may send and receive data between itself and UE 104.

BS 102 includes controller/processor 240, which may be configured to implement various functions related to wireless communications. In the depicted example, controller/processor 240 includes sidelink AGC component 241, which may be representative of sidelink AGC component 199 of FIG. 1. Notably, while depicted as an aspect of controller/processor 240, sidelink AGC component 241 may be implemented additionally or alternatively in various other aspects of BS 102 in other implementations.

Generally, UE 104 includes various processors (e.g., 258, 264, 266, and 280), antennas 252a-r (collectively 252), transceivers 254a-r (collectively 254), which include modulators and demodulators, and other aspects, which enable wireless transmission of data (e.g., data source 262) and wireless reception of data (e.g., data sink 260).

UE 104 includes controller/processor 280, which may be configured to implement various functions related to wireless communications. In the depicted example, controller/processor 280 includes sidelink AGC component 281, which may be representative of sidelink AGC component 198 of FIG. 1. Notably, while depicted as an aspect of controller/processor 280, sidelink AGC component 281 may be implemented additionally or alternatively in various other aspects of UE 104 in other implementations.

FIGS. 3A, 3B, 3C, and 3D depict aspects of data structures for a wireless communication network, such as wireless communication network 100 of FIG. 1. In particular, FIG. 3A is a diagram 300 illustrating an example of a first subframe within a 5G (e.g., 5G NR) frame structure, FIG. 3B is a diagram 330 illustrating an example of DL channels within a 5G subframe, FIG. 3C is a diagram 350 illustrating an example of a second subframe within a 5G frame structure, and FIG. 3D is a diagram 380 illustrating an example of UL channels within a 5G subframe.

Further discussions regarding FIG. 1, FIG. 2, and FIGS. 3A, 3B, 3C, and 3D are provided later in this disclosure.

Introduction to Sidelink Slot Structures

Some wireless communication systems allow user equipment (UEs) to communicate directly with each other sidelink communications, for example, base station to base station or user equipment to user equipment. For example, one UE participating in sidelink communications may be referred to as the transmitting (Tx) UE and another may be referred to as the receiving (Rx) UE.

In a typical sidelink slot structure, an initial/first symbol in time (e.g., symbol 0 for a zero-indexed slot) may be used by the UE to transmit a symbol dedicated for AGC. Mini-slots are structured similarly to the typical sidelink slot structure, but with shorter lengths. For example, a mini-slot may be 3, 4, 5, 6 or 7 OFDM symbols in length. Mini-slots may likewise include an initial symbol designated for AGC followed by one or more symbols for PSCCH and PSSCH signals. A slot containing multiple mini-slots will generally include a gap symbol separating the mini-slots.

Although the term "slot" is frequently used to describe the time-domain resources of a sidelink transmission, it can be appreciated that any other suitable time window may be used with, or as an alternative, according to the features of this disclosure.

Figure 4A:
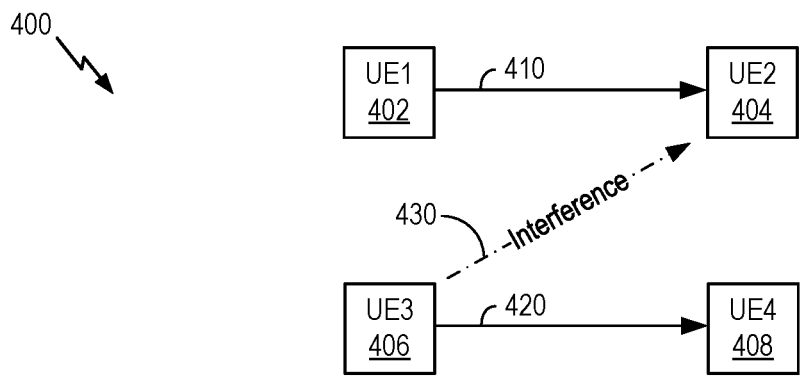
FIGS. 4A, 4B, and 4C depict aspects of automatic gain control in sidelink communications between user equipments.
Figure 4B:
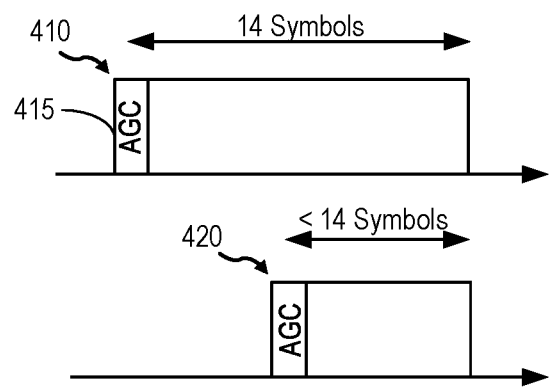
Figure 4C:
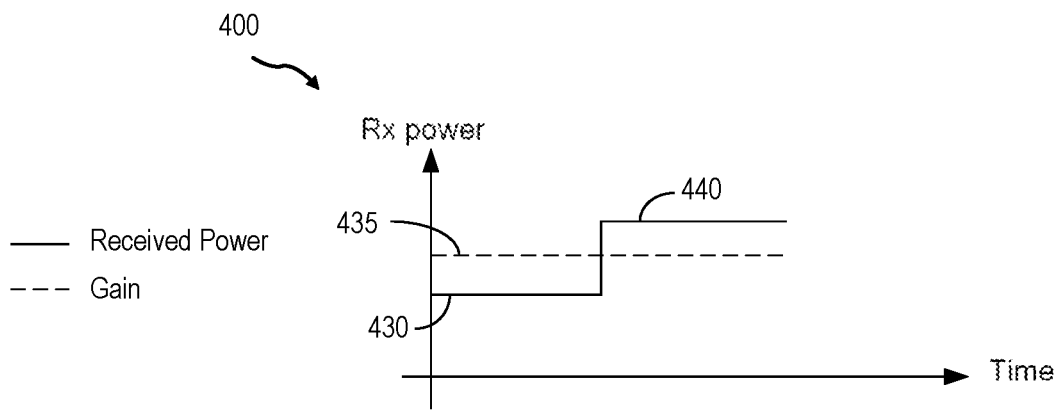

Aspects Related to Sidelink Communications with Symbols Designated for Automatic Gain Control FIGS. 4A, 4B, and 4C depict aspects of automatic gain control in sidelink communications 400 between user equipments.

In FIG. 4A, a first UE 402 transmits a first sidelink communication 410 (using a slot structure depicted in FIG. 4B) to a second UE 404. Simultaneously, a third UE 406 transmits a second sidelink communication 420 (using a mini-slot structure depicted in FIG. 4B) to a fourth UE 408. While the second UE 404 is not the intended recipient of the second sidelink communication 420, the second UE 404 may nevertheless receive the second sidelink communication 420 as interference 430 while attempting to receive the first sidelink communication 410.

FIG. 4C depicts the received power from the perspective of the second UE 404 in FIG. 4A. Notably, in the middle of the slot, the interference 430 created by sidelink communication 420 increases the received power from an initial level 430 to a second, higher level 440. Assuming that the second UE 404 set its automatic gain control to a level 435 based on the received power level 430 (e.g., based on receiving symbol 415 designated for AGC as depicted in FIG. 4B), then the increase in received power to level 440 may cause signal reception issues, such as ADC overflow because the gain necessary for received power level 430 is different than that of received power level 440, but the gain level 435 does not change during the slot. This is because conventionally a user equipment sets its AGC level for the duration of a sidelink slot, which may be defined in some cases by a sidelink start symbol parameter and a sidelink symbol length parameter. Thus, it is apparent that configuring gain via AGC algorithms may be affected by signals received by a user equipment that are not intended for that user equipment, such as in the case of second UE 404 receiving interference 430.

Accordingly, aspects herein provide techniques for performing automatic gain control with multiple symbols dedicated to AGC during a slot. As described in more detail below, these aspects may improve upon both of the aforementioned technical problems. Namely, configuring sidelink communications with multiple AGC symbols adjusts for potential receiving power increases when a mini-slot is received as interference during a slot intended for a receiving user equipment. By adjusting the gain multiple times (using the multiple AGC symbols) during a slot, interference is reduced, SNR is improved, and corrupted communications are avoided.

Figure 5A:
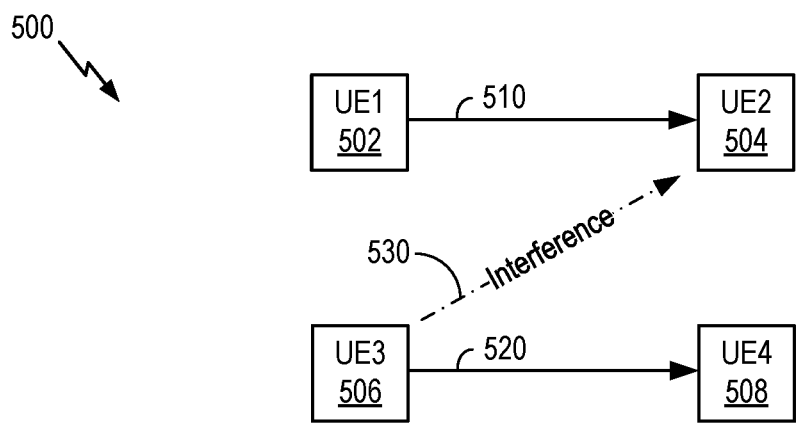
FIGS. 5A, 5B, and 5C depict aspects of automatic gain control using multiple AGC symbols in sidelink communications between user equipments.
Figure 5B:
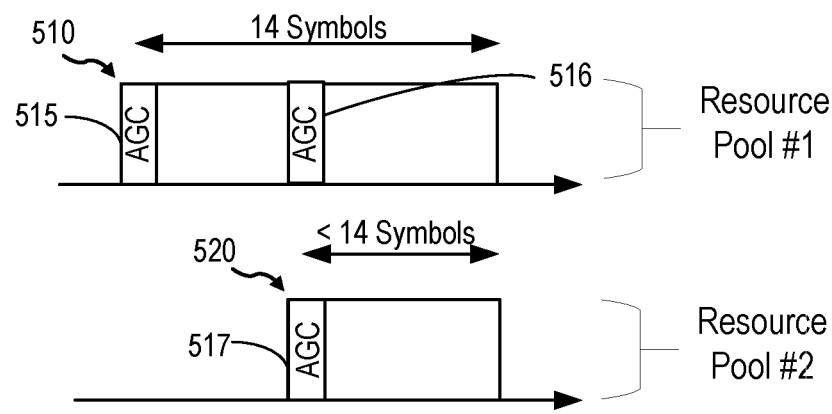
Figure 5C:
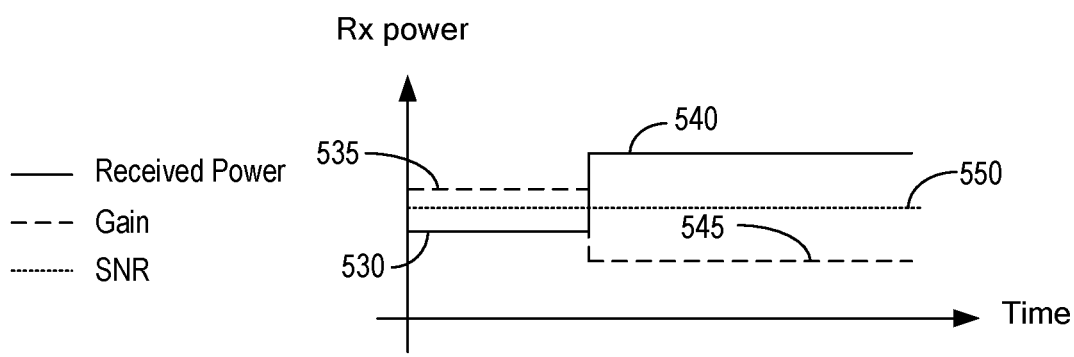

Aspects Related to Sidelink Communications with Multiple Automatic Gain Control Symbols FIGS. 5A, 5B, and 5C depict aspects of automatic gain control using multiple AGC symbols in sidelink communications 500 between user equipments.

As in the example of FIG. 4A, here in FIG. 5A, a first UE 502 transmits a first sidelink communication 510 (using a slot structure 510 depicted in FIG. 5B) to a second UE 504. Simultaneously, a third UE 506 transmits a second sidelink communication 520 (using a mini-slot structure 520 depicted in FIG. 5B) to a fourth UE 508. While the second UE 504 is not the intended recipient of the second sidelink communication 520, the second UE 504 nevertheless receives the second sidelink communication 520 as interference 530 while attempting to receive the first sidelink communication 510.

The slot structure corresponding to the first sidelink communication 510 depicted in FIG. 5B has a first AGC symbol 515 as the first symbol in the slot structure. The slot structure also has a second AGC symbol 516, aligned with the beginning 517 of the mini-slot structure corresponding to the second sidelink communication 520. The location of the second AGC symbol 516 corresponds to a location where the Rx UE may receive interference 530 from the second sidelink communication 520, and thus allows the second UE 504 to (re) adjust its AGC level intra-slot in order to prevent, for example, an ADC overflow. In the example depicted in FIG. 5B, a slot format which includes fourteen symbols is shown. However, in other examples, condensed slot formats (e.g., with twelve symbols) may likewise be used.

Note that in FIG. 5B, the slot structure for the first sidelink communication 510 is configured as part of a first resource pool while the mini-slot structure for the second sidelink communication 520 is configured as part of a second resource pool. Despite the different resource pools, it is still possible for the second sidelink communication 520 to cause interference, thus the value of an additional AGC symbol 516 to adjust AGC intra-slot.

FIG. 5C depicts the received power from the perspective of the second UE 504 in FIG. 5A. As in the example of FIG. 4C, in the middle of the slot, the interference level 530 created by the second sidelink communication 520 increases the received power from the initial level 530 to a second, higher level 540. However, in this example, because the second UE 504 is adjusting AGC based on the additional AGC symbol 516, it senses the increased received signal power from interference 530 and therefore adjusts its AGC from a first level 535 to a second level 545, which in this case is lower due to the increased received power. Note that in an opposite scenario, such as where the received signal decreased, then the second UE 504 may increase its AGC setting to a higher level (e.g., perform the converse operation).

Beneficially, as compared to the example in FIGS. 4A-4C, the signal-to-noise (SNR) ratio 550 remains consistent, which leads to consistent communication performance. This in-turn may lead to reduced communication latency through avoided retransmissions and a better user experience.

Figure 6:
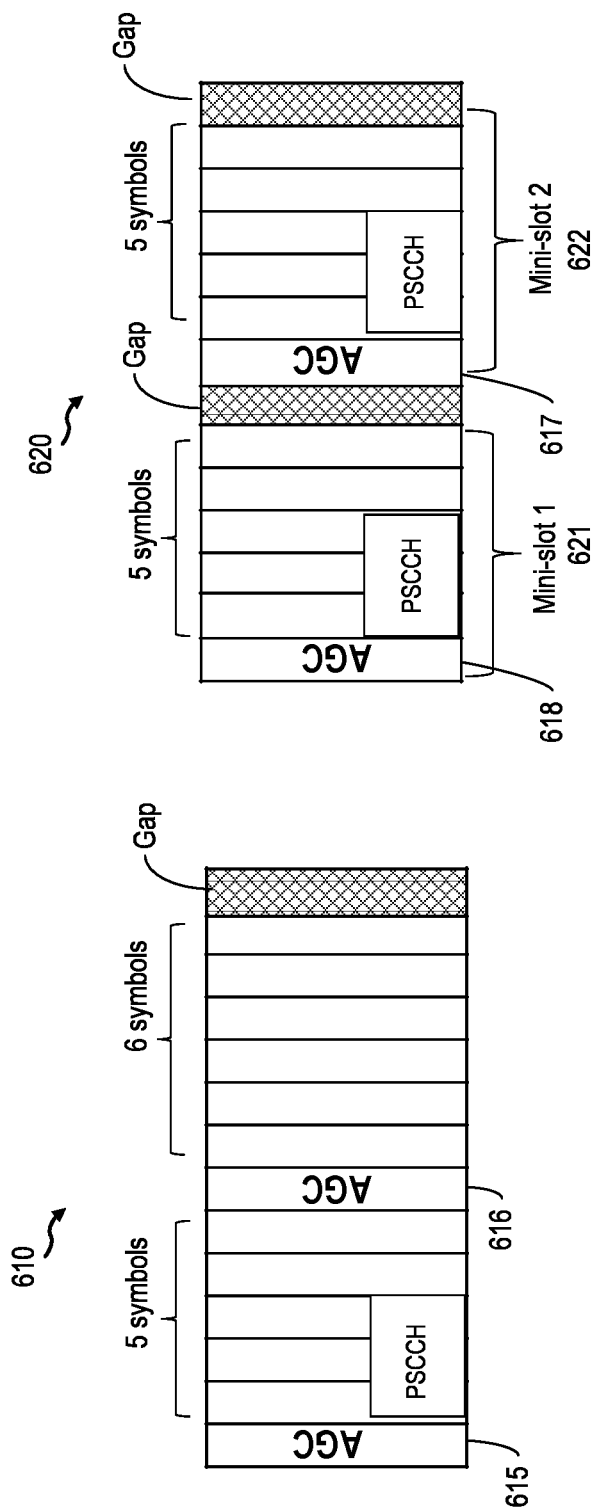
FIG. 6 depicts example slot structures with multiple automatic gain control symbols.

FIG. 6 depicts example slot structures with multiple AGC symbols. The first slot structure 610 may be used, for example, in a resource pool with slot-based transmission and comprises a first AGC symbol 615 at the first symbol within the slot structure, and a second AGC symbol 616 at the seventh symbol within the slot structure.

The second slot structure 620 may be used, for example, in a resource pool with mini-slot based transmission and comprises a first AGC symbol 618 followed by a first mini-slot 621. The location of the first AGC symbol 618 of the second slot structure 620 corresponds to the location of the first AGC symbol 615 in the first slot structure 610. The second slot structure 620 also comprises a second AGC symbol 617 followed by a second mini-slot 622. The location of the second AGC symbol 617 of the second slot structure 620 corresponds to the location of the second AGC symbol 616 of the first slot structure 610. Thus, multiple resource pools may be configured with multiple AGC symbols in the same location (e.g., in the same symbol location) despite having different internal slot structures. This may be useful for implementation so that all user equipments are aware of the potential location of AGC symbols.

Example Methods

Figure 7:
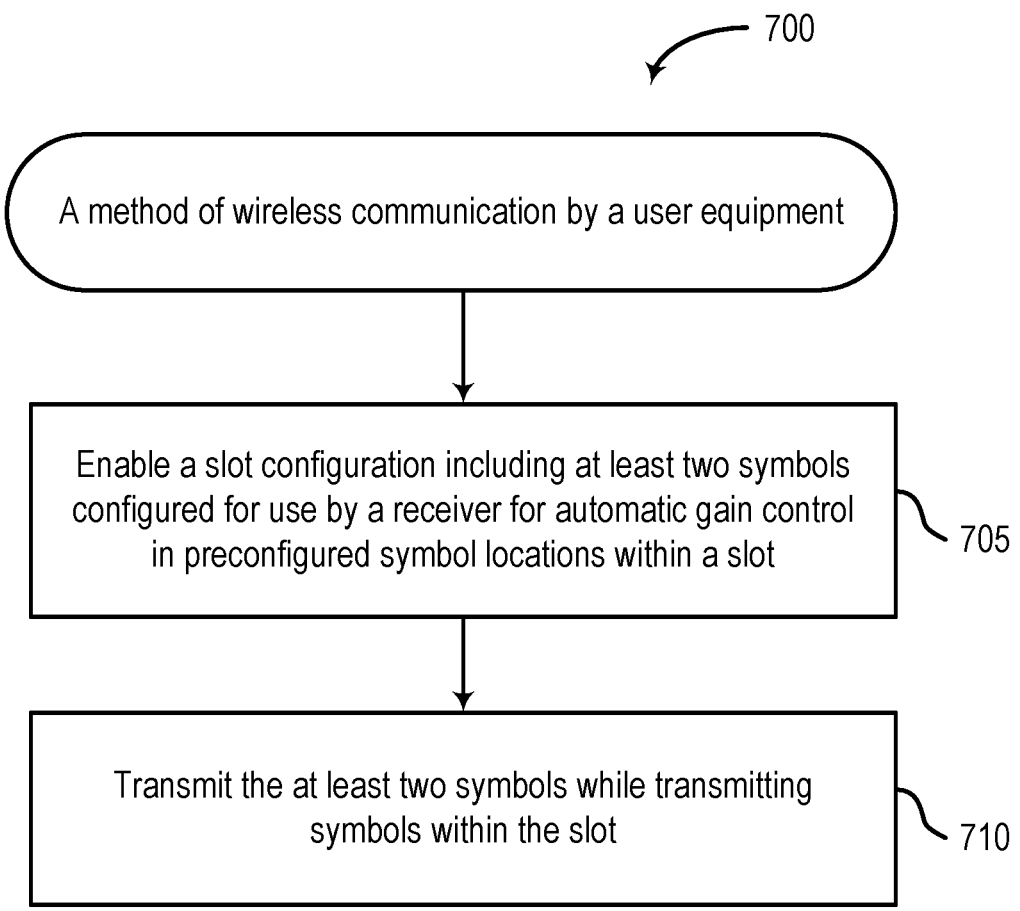
FIGS. 7, 8, and 9 depict example processes for wireless communication according to aspects of the present disclosure.

FIG. 7 shows an example of a method 700 for wireless communication according to aspects of the present disclosure. In some aspects, a user equipment, such as UE 104 of FIGS. 1 and 2, or processing system 1005 of FIG. 10, may perform the method 700.

Method 700 begins at step 705 with enabling a slot configuration including at least two symbols configured for use by a receiver for automatic gain control in preconfigured symbol locations within a slot. In some cases, the operations of this step refer to, or may be performed by, slot configuration circuitry as described with reference to FIG. 10.

Method 700 then proceeds to step 710 with transmitting the at least two symbols while transmitting symbols within the slot. In some cases, the operations of this step refer to, or may be performed by, symbol transmission circuitry as described with reference to FIG. 10.

In some aspects, the slot configuration is associated with a resource pool configuration in which all slot configurations associated with the resource pool configuration include the at least two symbols configured for use by a receiver for automatic gain control in the preconfigured symbol locations. In some aspects, the method 700 further includes receiving the resource pool configuration from a base station.

In some aspects, the slot configuration comprises at least two mini-slots within the slot. In some aspects, each mini-slot of the at least two mini-slots comprises one symbol of the at least two symbols configured for use by a receiver for automatic gain control as a first symbol in the mini-slot. In some aspects, each mini-slot of the at least two mini-slots is separated by at least one gap symbol within the slot. In some aspects, the slot is a sidelink slot.

Figure 8:
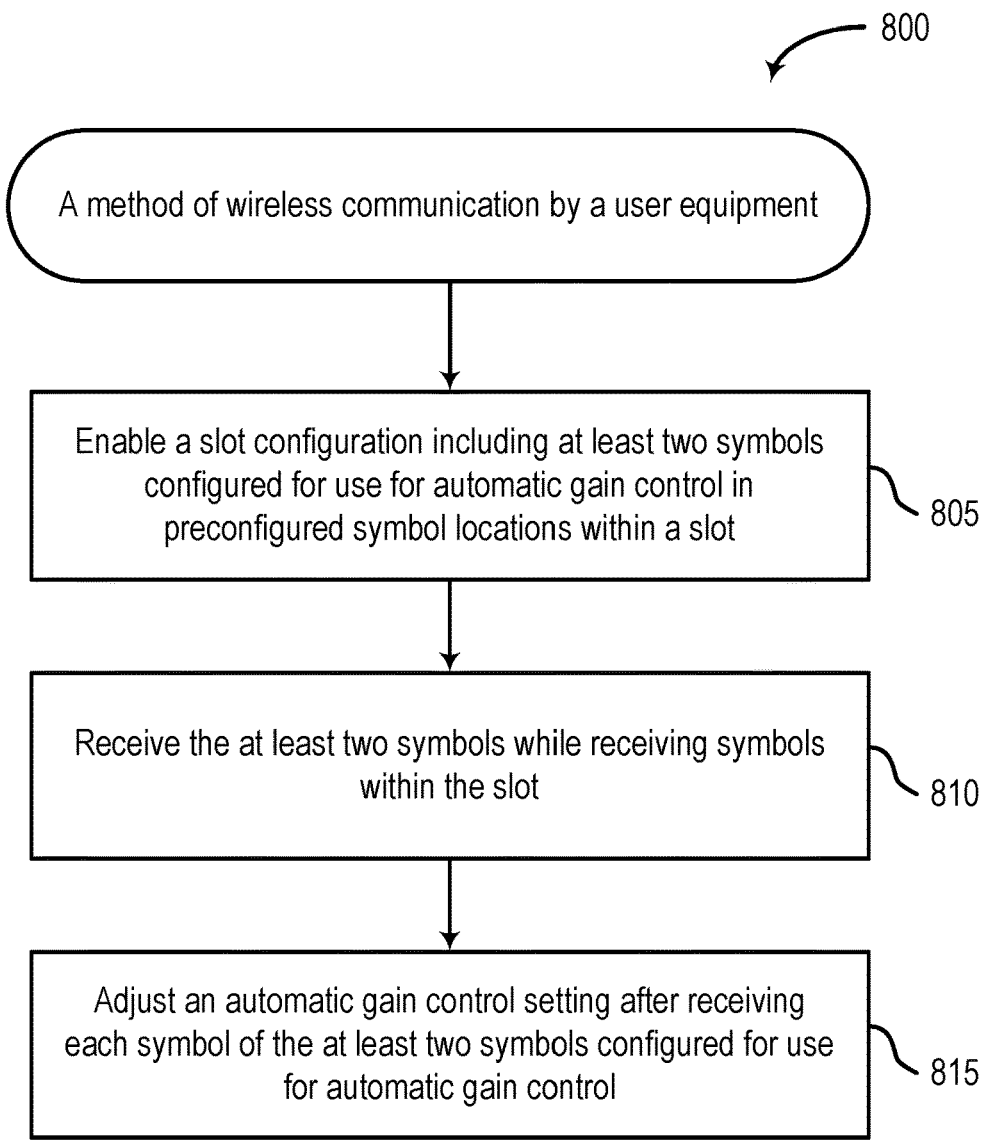

FIG. 8 shows an example of a method 800 for wireless communication according to aspects of the present disclosure. In some aspects, a user equipment, such as UE 104 of FIGS. 1 and 2, or processing system 1005 of FIG. 10, may perform the method 800.

Method 800 begins at step 805 with enabling a slot configuration including at least two symbols configured for use for automatic gain control in preconfigured symbol locations within a slot. In some cases, the operations of this step refer to, or may be performed by, slot configuration circuitry as described with reference to FIG. 10.

Method 800 then proceeds to step 810 with receiving the at least two symbols while receiving symbols within the slot. In some cases, the operations of this step refer to, or may be performed by, symbol reception circuitry as described with reference to FIG. 10.

Method 800 then proceeds to step 815 with adjusting an automatic gain control setting after receiving each symbol of the at least two symbols configured for use for automatic gain control. In some cases, the operations of this step refer to, or may be performed by, AGC configuration circuitry as described with reference to FIG. 10.

In some aspects, the slot configuration is associated with a resource pool configuration in which all slot configurations associated with the resource pool configuration include the at least two symbols configured for use by a receiver for automatic gain control in the preconfigured symbol locations. In some aspects, the method 700 further includes receiving the resource pool configuration from a base station.

In some aspects, the slot configuration comprises at least two mini-slots within the slot. In some aspects, each mini-slot of the at least two mini-slots comprises one symbol of the at least two symbols configured for use for automatic gain control as a first symbol in the mini-slot. In some aspects, each mini-slot of the at least two mini-slots is separated by at least one gap symbol within the slot. In some aspects, the slot is a sidelink slot.

Figure 9:
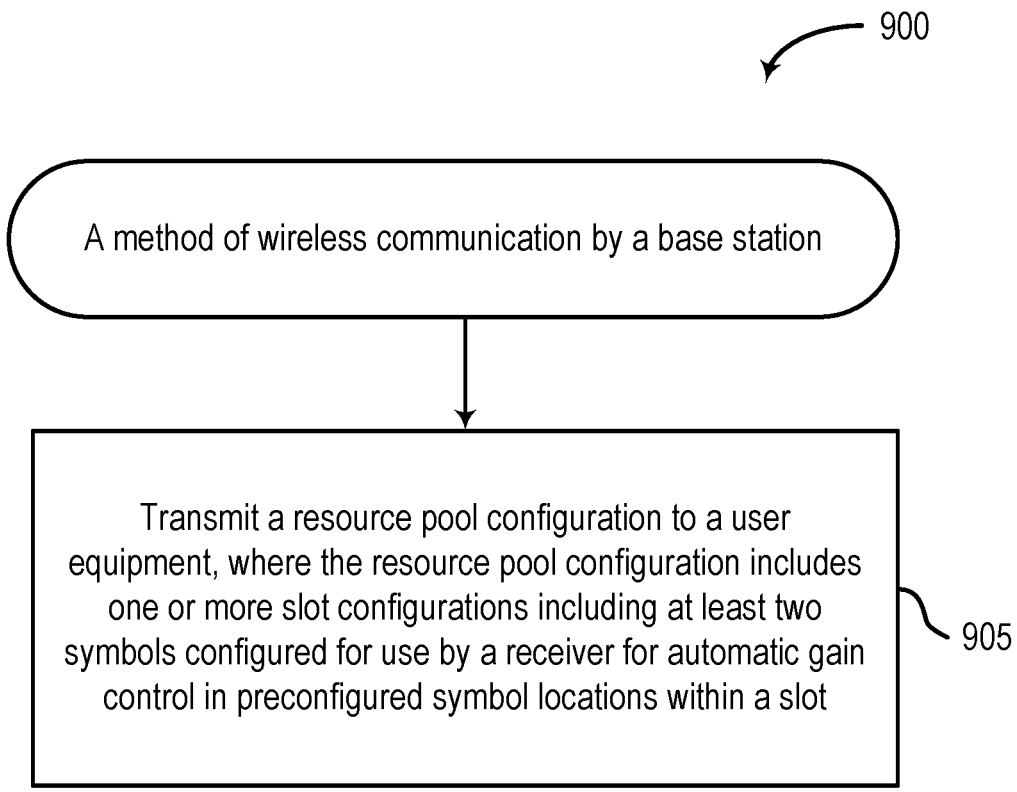

FIG. 9 shows an example of a method 900 for wireless communication according to aspects of the present disclosure. In some aspects, a user equipment, such as BS 102 of FIGS. 1 and 2, or processing system 1105 of FIG. 11, may perform the method 900.

Method 900 begins at step 905 with transmitting a resource pool configuration to a user equipment, where the resource pool configuration includes one or more slot configurations including at least two symbols configured for use by a receiver for automatic gain control in preconfigured symbol locations within a slot. In some cases, the operations of this step refer to, or may be performed by, UE resource pool configuration circuitry as described with reference to FIG. 11.

In some aspects, at least one of the one or more slot configurations comprises at least two mini-slots within the slot. In some aspects, each mini-slot of the at least two mini-slots comprises one symbol of the at least two symbols configured for use by a receiver for automatic gain control as a first symbol in the mini-slot. In some aspects, each mini-slot of the at least two mini-slots is separated by at least one gap symbol within the slot. In some aspects, at least one slot configuration of the one or more slot configurations comprises a sidelink slot configuration.

Example Wireless Communication Device

Figure 10:
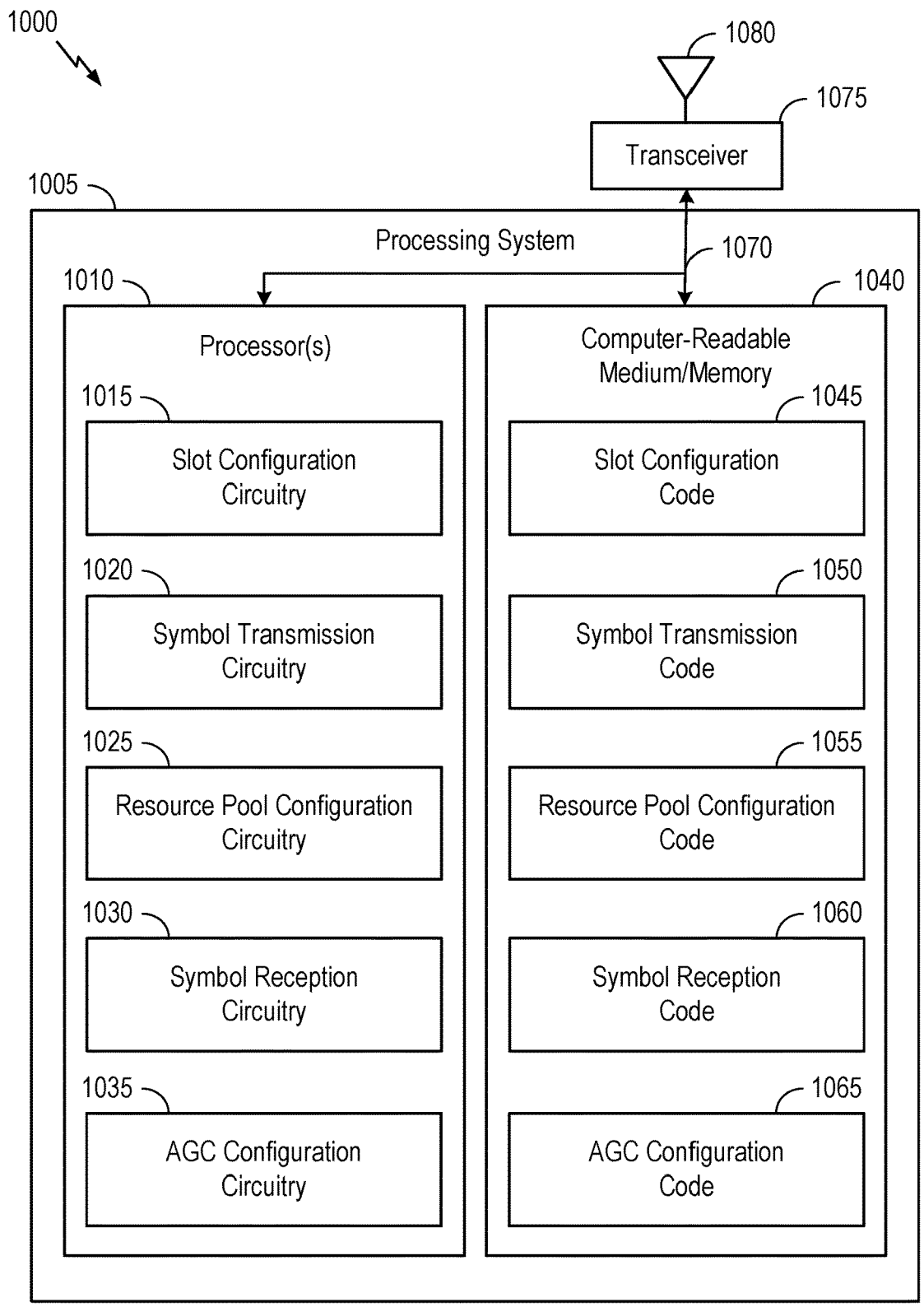
FIGS. 10 and 11 depict example communication devices according to aspects of the present disclosure.

FIG. 10 depicts an example communications device 1000 that includes various components operable, configured, or adapted to perform operations for the techniques disclosed herein, such as the operations depicted and described with respect to FIGS. 7-8. In some examples, communication device 1000 may be a UE 104 as described, for example with respect to FIGS. 1 and 2.

Communications device 1000 includes a processing system 1005 coupled to the transceiver 1075 (e.g., a transmitter and/or a receiver). The transceiver 1075 is configured to transmit (or send) and receive signals for the communications device 1000 via the antenna 1080, such as the various signals as described herein. The transceiver 1075 may communicate bi-directionally, via the antennas 1080, wired links, or wireless links as described herein. For example, the transceiver 1075 may represent a wireless transceiver and may communicate bi-directionally with another wireless transceiver. The transceiver 1075 may also include or be connected to a modem to modulate the packets and provide the modulated packets to for transmission, and to demodulate received packets. In some examples, the transceiver 1075 may be tuned to operate at specified frequencies. For example, a modem can configure the transceiver 1075 to operate at a specified frequency and power level based on the communication protocol used by the modem.

Processing system 1005 may be configured to perform processing functions for communications device 1000, including processing signals received and/or to be transmitted by communications device 1000. Processing system 1005 includes one or more processors 1010 coupled to a computer-readable medium/memory 1040 via a bus 1070.

In some examples, one or more processors 1010 may include one or more intelligent hardware devices, (e.g., a general-purpose processing component, a digital signal processor (DSP), a central processing unit (CPU), a graphics processing unit (GPU), a microcontroller, an application specific integrated circuit (ASIC), a field programmable gate array (FPGA), a programmable logic device, a discrete gate or transistor logic component, a discrete hardware component, or any combination thereof). In some cases, the one or more processors 1010 are configured to operate a memory array using a memory controller. In other cases, a memory controller is integrated into the one or more processors 1010. In some cases, the one or more processors 1010 are configured to execute computer-readable instructions stored in a memory to perform various functions. In some aspects, one or more processors 1010 include special purpose components for modem processing, baseband processing, digital signal processing, or transmission processing.

In certain aspects, computer-readable medium/memory 1040 is configured to store instructions (e.g., computer-executable code) that when executed by the one or more processors 1010, cause the one or more processors 1010 to perform the operations illustrated in FIGS. 7-8, or other operations for performing the various techniques discussed herein.

In one aspect, computer-readable medium/memory 1040 includes slot configuration code 1045, symbol transmission code 1050, resource pool configuration code 1055, symbol reception code 1060, and AGC configuration code 1065.

Examples of a computer-readable medium/memory 1040 include random access memory (RAM), read-only memory (ROM), solid state memory, a hard drive, a hard disk drive, etc. In some examples, computer-readable medium/memory 1040 is used to store computer-readable, computer-executable software including instructions that, when executed, cause a processor to perform various functions described herein. In some cases, the memory contains, among other things, a basic input/output system (BIOS) which controls basic hardware or software operation such as the interaction with peripheral components or devices. In some cases, a memory controller operates memory cells. For example, the memory controller can include a row decoder, column decoder, or both. In some cases, memory cells within a memory store information in the form of a logical state.

Various components of communications device 1000 may provide means for performing the methods described herein, including with respect to FIGS. 7-8.

In some examples, means for transmitting or sending (or means for outputting for transmission) may include transceivers 254 and/or antenna(s) 252 of the UE 104 illustrated in FIG. 2 and/or the transceiver 1075 and the antenna 1080 of the communication device in FIG. 10.

In some examples, means for receiving (or means for obtaining) may include transceivers 254 and/or antenna(s) 252 of the UE 104 illustrated in FIG. 2 and/or the transceiver 1075 and the antenna 1080 of the communication device in FIG. 10.

In some examples, means for enabling, transmitting, receiving, and adjusting may include various processing system 1005 components, such as: the one or more processors 1010 in FIG. 10, or aspects of the UE 104 depicted in FIG. 2, including receive processor 258, transmit processor 264, TX MIMO processor 266, and/or controller/processor 280 (including sidelink AGC component 281).

In one aspect, one or more processors 1010 includes slot configuration circuitry 1015, symbol transmission circuitry 1020, resource pool configuration circuitry 1025, symbol reception circuitry 1030, and AGC configuration circuitry 1035.

According to some aspects, slot configuration circuitry 1015 enables a slot configuration including at least two symbols configured for use (e.g., by a receiver) for automatic gain control in preconfigured symbol locations within a slot.

According to some aspects, symbol transmission circuitry 1020 transmits the at least two symbols while transmitting symbols within the slot.

In some examples, symbol reception circuitry 1030 receives the at least two symbols while receiving symbols within the slot. In some examples, AGC configuration circuitry 1035 adjusts an automatic gain control setting after receiving each symbol of the at least two symbols configured for use for automatic gain control.

In some aspects, the slot configuration is associated with a resource pool configuration in which all slot configurations associated with the resource pool configuration include the at least two symbols configured for use by a receiver for automatic gain control in the preconfigured symbol locations. According to some aspects, resource pool configuration circuitry 1025 receives the resource pool configuration from a base station.

In some aspects, the slot configuration includes at least two mini-slots within the slot. In some aspects, each mini-slot of the at least two mini-slots includes one symbol of the at least two symbols configured for use by a receiver for automatic gain control as a first symbol in the mini-slot. In some aspects, each mini-slot of the at least two mini-slots is separated by at least one gap symbol within the slot. In some aspects, the slot is a sidelink slot.

Notably, FIG. 10 is just one example, and many other examples and configurations of communication device are possible.

Figure 11:
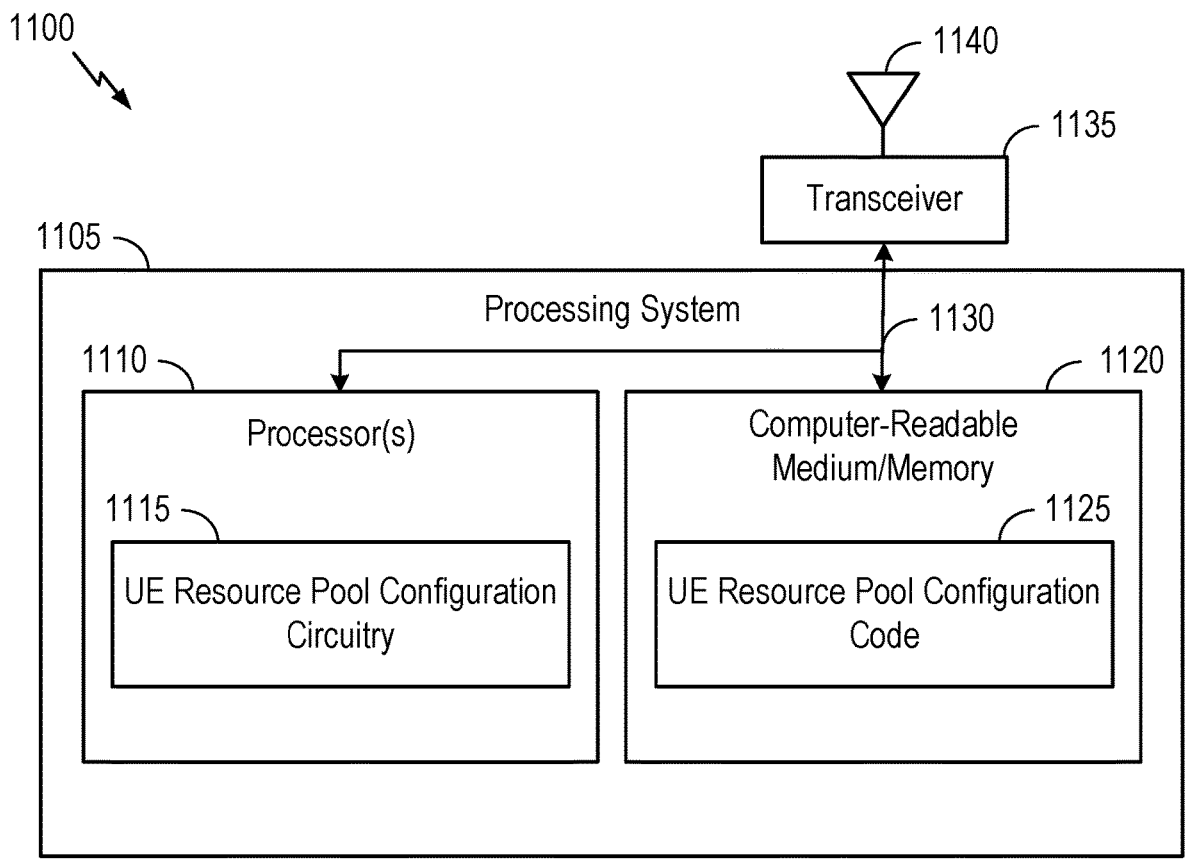

FIG. 11 depicts an example communications device 1100 that includes various components operable, configured, or adapted to perform operations for the techniques disclosed herein, such as the operations depicted and described with respect to FIG. 9. In some examples, communication device 1100 may be a BS 102 as described, for example with respect to FIGS. 1 and 2.

Communications device 1100 includes a processing system 1105 coupled to the transceiver 1135 (e.g., a transmitter and/or a receiver). The transceiver 1135 is configured to transmit (or send) and receive signals for the communications device 1100 via the antenna 1140, such as the various signals as described herein. The transceiver 1135 may communicate bi-directionally, via the antennas 1140, wired links, or wireless links as described herein. For example, the transceiver 1135 may represent a wireless transceiver and may communicate bi-directionally with another wireless transceiver. The transceiver 1135 may also include or be connected to a modem to modulate the packets and provide the modulated packets to for transmission, and to demodulate received packets. In some examples, the transceiver 1135 may be tuned to operate at specified frequencies. For example, a modem can configure the transceiver 1135 to operate at a specified frequency and power level based on the communication protocol used by the modem.

Processing system 1105 may be configured to perform processing functions for communications device 1100, including processing signals received and/or to be transmitted by communications device 1000. Processing system 1105 includes one or more processors 1110 coupled to a computer-readable medium/memory 1120 via a bus 1130.

In some examples, one or more processors 1110 may include one or more intelligent hardware devices, (e.g., a general-purpose processing component, a DSP, a CPU, a GPU, a microcontroller, an ASIC, a FPGA, a programmable logic device, a discrete gate or transistor logic component, a discrete hardware component, or any combination thereof). In some cases, the one or more processors 1110 are configured to operate a memory array using a memory controller.

In other cases, a memory controller is integrated into the one or more processors 1110. In some cases, the one or more processors 1110 are configured to execute computer-readable instructions stored in a memory to perform various functions. In some aspects, one or more processors 1110 include special purpose components for modem processing, baseband processing, digital signal processing, or transmission processing.

In certain aspects, computer-readable medium/memory 1120 is configured to store instructions (e.g., computer-executable code) that when executed by the one or more processors 1110, cause the one or more processors 1110 to perform the operations illustrated in FIG. 9, or other operations for performing the various techniques discussed herein.

In one aspect, computer-readable medium/memory 1120 includes UE resource pool configuration code 1125.

Examples of a computer-readable medium/memory 1120 include RAM, ROM, solid state memory, a hard drive, a hard disk drive, etc. In some examples, computer-readable medium/memory 1120 is used to store computer-readable, computer-executable software including instructions that, when executed, cause a processor to perform various functions described herein. In some cases, the memory contains, among other things, a BIOS which controls basic hardware or software operation such as the interaction with peripheral components or devices. In some cases, a memory controller operates memory cells. For example, the memory controller can include a row decoder, column decoder, or both. In some cases, memory cells within a memory store information in the form of a logical state.

Various components of communications device 1100 may provide means for performing the methods described herein, including with respect to FIG. 9.

In some examples, means for transmitting or sending (or means for outputting for transmission) may include transceivers 232 and/or antenna(s) 234 of the BS 102 illustrated in FIG. 2 and/or the transceiver 1135 and the antenna 1140 of the communication device in FIG. 11.

In some examples, means for receiving (or means for obtaining) may include transceivers 232 and/or antenna(s) 234 of the BS 102 illustrated in FIG. 2 and/or the transceiver 1135 and the antenna 1140 of the communication device in FIG. 11.

In some examples, means for transmitting may include various processing system 1105 components, such as: the one or more processors 1110 in FIG. 11, or aspects of the BS 102 depicted in FIG. 2, including receive processor 238, transmit processor 220, TX MIMO processor 230, and/or controller/processor 240 (including sidelink AGC component 241).

In one aspect, one or more processors 1110 includes UE resource pool configuration circuitry 1115. According to some aspects, UE resource pool configuration circuitry 1115 transmits a resource pool configuration to a user equipment, where the resource pool configuration includes one or more slot configurations including at least two symbols configured for use by a receiver for automatic gain control in preconfigured symbol locations within a slot. In some aspects, at least one of the one or more slot configurations includes at least two mini-slots within the slot. In some aspects, each mini-slot of the at least two mini-slots includes one symbol of the at least two symbols configured for use by a receiver for automatic gain control as a first symbol in the mini-slot. In some aspects, each mini-slot of the at least two mini-slots is separated by at least one gap symbol within the slot. In some aspects, at least one slot configuration of the one or more slot configurations includes a sidelink slot configuration.

Notably, FIG. 11 is just one example, and many other examples and configurations of communication device are possible.

EXAMPLE CLAUSES

Implementation examples are described in the following numbered clauses:

Clause 1: A method for wireless communication by a user equipment, the method comprising: enabling a slot configuration comprising at least two symbols configured for use by a receiver for automatic gain control in preconfigured symbol locations within a slot; and transmitting the at least two symbols while transmitting symbols within the slot.

Clause 2: The method of Clause 1, wherein the slot configuration is associated with a resource pool configuration in which all slot configurations associated with the resource pool configuration include the at least two symbols configured for use by a receiver for automatic gain control in the preconfigured symbol locations.

Clause 3: The method of Clause 2, further comprising: receiving the resource pool configuration from a base station.

Clause 4: The method of any one of Clauses 1-3, wherein the slot configuration comprises at least two mini-slots within the slot.

Clause 5: The method of Clause 4, wherein each mini-slot of the at least two mini-slots comprises one symbol of the at least two symbols configured for use by a receiver for automatic gain control as a first symbol in the mini-slot.

Clause 6: The method of Clause 5, wherein each mini-slot of the at least two mini-slots is separated by at least one gap symbol within the slot.

Clause 7: The method of any one of Clauses 1-6, wherein the slot is a sidelink slot.

Clause 8: A method for wireless communication by a user equipment, the method comprising: enabling a slot configuration comprising at least two symbols configured for use for automatic gain control in preconfigured symbol locations within a slot; receiving the at least two symbols while receiving symbols within the slot; and adjusting an automatic gain control setting after receiving each symbol of the at least two symbols configured for use for automatic gain control.

Clause 9: The method of Clause 8, wherein the slot configuration is associated with a resource pool configuration in which all slot configurations associated with the resource pool configuration include the at least two symbols configured for use by a receiver for automatic gain control in the preconfigured symbol locations.

Clause 10: The method of Clause 9, further comprising: receiving the resource pool configuration from a base station.

Clause 11: The method of any one of Clauses 8-10, wherein the slot configuration comprises at least two mini-slots within the slot.

Clause 12: The method of Clause 11, wherein each mini-slot of the at least two mini-slots comprises one symbol of the at least two symbols configured for use for automatic gain control as a first symbol in the mini-slot.

Clause 13: The method of Clause 12, wherein each mini-slot of the at least two mini-slots is separated by at least one gap symbol within the slot.

Clause 14: The method of any one of Clauses 8-13, wherein the slot is a sidelink slot.

Clause 15: A method for wireless communication by a base station, the method comprising: transmitting a resource pool configuration to a user equipment, wherein the resource pool configuration comprises one or more slot configurations comprising at least two symbols configured for use by a receiver for automatic gain control in preconfigured symbol locations within a slot.

Clause 16: The method of Clause 15, wherein at least one of the one or more slot configurations comprises at least two mini-slots within the slot.

Clause 17: The method of Clause 16, wherein each mini-slot of the at least two mini-slots comprises one symbol of the at least two symbols configured for use by a receiver for automatic gain control as a first symbol in the mini-slot.

Clause 18: The method of Clause 16, wherein each mini-slot of the at least two mini-slots is separated by at least one gap symbol within the slot.

Clause 19: The method of any one of Clauses 15-18, wherein at least one slot configuration of the one or more slot configurations comprises a sidelink slot configuration.

Clause 20: A processing system, comprising: a memory comprising computer-executable instructions; one or more processors configured to execute the computer-executable instructions and cause the processing system to perform a method in accordance with any one of Clauses 1-19.

Clause 21: A processing system, comprising means for performing a method in accordance with any one of Clauses 1-19.

Clause 22: A non-transitory computer-readable medium comprising computer-executable instructions that, when executed by one or more processors of a processing system, cause the processing system to perform a method in accordance with any one of Clauses 1-19.

Clause 23: A computer program product embodied on a computer-readable storage medium comprising code for performing a method in accordance with any one of Clauses 1-19.

Additional Wireless Communication Network Considerations

The techniques and methods described herein may be used for various wireless communications networks (or wireless wide area network (WWAN)) and radio access technologies (RATs). While aspects may be described herein using terminology commonly associated with 3G, 4G, and/or 5G (e.g., 5G new radio (NR)) wireless technologies, aspects of the present disclosure may likewise be applicable to other communication systems and standards not explicitly mentioned herein.

5G wireless communication networks may support various advanced wireless communication services, such as enhanced mobile broadband (eMBB), millimeter wave (mmWave), machine type communications (MTC), and/or mission critical targeting ultra-reliable, low-latency communications (URLLC). These services, and others, may include latency and reliability requirements.

Returning to FIG. 1, various aspects of the present disclosure may be performed within the example wireless communication network 100.

In 3GPP, the term "cell" can refer to a coverage area of a NodeB and/or a narrowband subsystem serving this coverage area, depending on the context in which the term is used. In NR systems, the term "cell" and BS, next generation NodeB (gNB or gNodeB), access point (AP), distributed unit (DU), carrier, or transmission reception point may be used interchangeably. A BS may provide communication coverage for a macro cell, a pico cell, a femto cell, and/or other types of cells.

A macro cell may generally cover a relatively large geographic area (e.g., several kilometers in radius) and may allow unrestricted access by UEs with service subscription. A pico cell may cover a relatively small geographic area (e.g., a sports stadium) and may allow unrestricted access by UEs with service subscription. A femto cell may cover a relatively small geographic area (e.g., a home) and may allow restricted access by UEs having an association with the femto cell (e.g., UEs in a Closed Subscriber Group (CSG) and UEs for users in the home). A BS for a macro cell may be referred to as a macro BS. A BS for a pico cell may be referred to as a pico BS. A BS for a femto cell may be referred to as a femto BS, home BS, or a home NodeB.

BSs 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., an S1 interface). BSs 102 configured for 5G (e.g., 5G NR or Next Generation RAN (NG-RAN)) may interface with 5GC 190 through second backhaul links 184. BSs 102 may communicate directly or indirectly (e.g., through the EPC 160 or 5GC 190) with each other over third backhaul links 134 (e.g., X2 interface). Third backhaul links 134 may generally be wired or wireless.

Small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. Small cell 102', employing NR in an unlicensed frequency spectrum, may boost coverage to and/or increase capacity of the access network.

Some base stations, such as BS 180 (e.g., gNB) may operate in a traditional sub-6 GHz spectrum, in millimeter wave (mmWave) frequencies, and/or near mmWave frequencies in communication with the UE 104. When the BS 180 operates in mmWave or near mm Wave frequencies, the BS 180 may be referred to as an mmWave base station.

The communication links 120 between BSs 102 and, for example, UEs 104, may be through one or more carriers. For example, BSs 102 and UEs 104 may use spectrum up to Y MHz (e.g., 5, 10, 15, 20, 100, 400, and other MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Wireless communication network 100 further includes a Wi-Fi access point (AP) 150 in communication with Wi-Fi stations (STAs) 152 via communication links 154 in, for example, a 2.4 GHz and/or 5 GHz unlicensed frequency spectrum. When communicating in an unlicensed frequency spectrum, the STAs 152/AP 150 may perform a clear channel assessment (CCA) prior to communicating in order to determine whether the channel is available.

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, 4G (e.g., LTE), or 5G (e.g., NR), to name a few options.

EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. MME 162 may be in communication with a Home Subscriber Server (HSS) 174. MME 162 is the control node that processes the signaling between the UEs 104 and the EPC 160. Generally, MME 162 provides bearer and connection management.

Generally, user Internet protocol (IP) packets are transferred through Serving Gateway 166, which itself is connected to PDN Gateway 172. PDN Gateway 172 provides UE IP address allocation as well as other functions. PDN Gateway 172 and the BM-SC 170 are connected to the IP Services 176, which may include, for example, the Internet, an intranet, an IP Multimedia Subsystem (IMS), a PS Streaming Service, and/or other IP services.

BM-SC 170 may provide functions for MBMS user service provisioning and delivery. BM-SC 170 may serve as an entry point for content provider MBMS transmission, may be used to authorize and initiate MBMS Bearer Services within a public land mobile network (PLMN), and may be used to schedule MBMS transmissions. MBMS Gateway 168 may be used to distribute MBMS traffic to the BSs 102 belonging to a Multicast Broadcast Single Frequency Network (MBSFN) area broadcasting a particular service, and may be responsible for session management (start/stop) and for collecting eMBMS related charging information.

5GC 190 may include an Access and Mobility Management Function (AMF) 192, other AMFs 193, a Session Management Function (SMF) 194, and a User Plane Function (UPF) 195. AMF 192 may be in communication with a Unified Data Management (UDM) 196.

AMF 192 is generally the control node that processes the signaling between UEs 104 and 5GC 190. Generally, AMF 192 provides QoS flow and session management.

All user Internet protocol (IP) packets are transferred through UPF 195, which is connected to the IP Services 197, and which provides UE IP address allocation as well as other functions for 5GC 190. IP Services 197 may include, for example, the Internet, an intranet, an IP Multimedia Subsystem (IMS), a PS Streaming Service, and/or other IP services.

Returning to FIG. 2, various example components of BS 102 and UE 104 (e.g., the wireless communication network 100 of FIG. 1) are depicted, which may be used to implement aspects of the present disclosure.

At BS 102, a transmit processor 220 may receive data from a data source 212 and control information from a controller/processor 240. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), and others. The data may be for the physical downlink shared channel (PDSCH), in some examples.

A medium access control (MAC)-control element (MAC-CE) is a MAC layer communication structure that may be used for control command exchange between wireless nodes. The MAC-CE may be carried in a shared channel such as a physical downlink shared channel (PDSCH), a physical uplink shared channel (PUSCH), or a physical sidelink shared channel (PSSCH).

Transmit processor 220 may process (e.g., encode and symbol map) the data and control information to obtain data symbols and control symbols, respectively. Transmit processor 220 may also generate reference symbols, such as for the primary synchronization signal (PSS), secondary synchronization signal (SSS), PBCH demodulation reference signal (DMRS), and channel state information reference signal (CSI-RS).

Transmit (TX) multiple-input multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for OFDM) to obtain an output sample stream. Each modulator may further process (e.g., convert to analog, amplify, filter, and upconvert) the output sample stream to obtain a downlink signal. Downlink signals from the modulators in transceivers 232a-232t may be transmitted via the antennas 234a-234t, respectively.

At UE 104, antennas 252a-252r may receive the downlink signals from the BS 102 and may provide received signals to the demodulators (DEMODs) in transceivers 254a-254r, respectively. Each demodulator in transceivers 254a-254r may condition (e.g., filter, amplify, downconvert, and digitize) a respective received signal to obtain input samples. Each demodulator may further process the input samples (e.g., for OFDM) to obtain received symbols.

MIMO detector 256 may obtain received symbols from all the demodulators in transceivers 254a-254r, perform MIMO detection on the received symbols if applicable, and provide detected symbols. Receive processor 258 may process (e.g., demodulate, deinterleave, and decode) the detected symbols, provide decoded data for the UE 104 to a data sink 260, and provide decoded control information to a controller/processor 280.

On the uplink, at UE 104, transmit processor 264 may receive and process data (e.g., for the physical uplink shared channel (PUSCH)) from a data source 262 and control information (e.g., for the physical uplink control channel (PUCCH) from the controller/processor 280. Transmit processor 264 may also generate reference symbols for a reference signal (e.g., for the sounding reference signal (SRS)). The symbols from the transmit processor 264 may be precoded by a TX MIMO processor 266 if applicable, further processed by the modulators in transceivers 254a-254r (e.g., for SC-FDM), and transmitted to BS 102.

At BS 102, the uplink signals from UE 104 may be received by antennas 234a-t, processed by the demodulators in transceivers 232a-232t, detected by a MIMO detector 236 if applicable, and further processed by a receive processor 238 to obtain decoded data and control information sent by UE 104. Receive processor 238 may provide the decoded data to a data sink 239 and the decoded control information to the controller/processor 240.

Memories 242 and 282 may store data and program codes for BS 102 and UE 104, respectively.

Scheduler 244 may schedule UEs for data transmission on the downlink and/or uplink.

5G may utilize orthogonal frequency division multiplexing (OFDM) with a cyclic prefix (CP) on the uplink and downlink. 5G may also support half-duplex operation using time division duplexing (TDD). OFDM and single-carrier frequency division multiplexing (SC-FDM) partition the system bandwidth into multiple orthogonal subcarriers, which are also commonly referred to as tones and bins. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The minimum resource allocation, called a resource block (RB), may be 12 consecutive subcarriers in some examples. The system bandwidth may also be partitioned into subbands. For example, a subband may cover multiple RBs. NR may support a base subcarrier spacing (SCS) of 15 KHz and other SCS may be defined with respect to the base SCS (e.g., 30 kHz, 60 kHz, 120 kHz, 240 kHz, and others).

As above, FIGS. 3A, 3B, 3C, and 3D depict various example aspects of data structures for a wireless communication network, such as wireless communication network 100 of FIG. 1.

In various aspects, the 5G frame structure may be frequency division duplex (FDD), in which for a particular set of subcarriers (carrier system bandwidth), subframes within the set of subcarriers are dedicated for either DL or UL. 5G frame structures may also be time division duplex (TDD), in which for a particular set of subcarriers (carrier system bandwidth), subframes within the set of subcarriers are dedicated for both DL and UL. In the examples provided by FIGS. 3A and 3C, the 5G frame structure is assumed to be TDD, with subframe 4 being configured with slot format 28 (with mostly DL), where D is DL, U is UL, and X is flexible for use between DL/UL, and subframe 3 being configured with slot format 34 (with mostly UL). While subframes 3, 4 are shown with slot formats 34, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description below applies also to a 5G frame structure that is TDD.

Other wireless communication technologies may have a different frame structure and/or different channels. A frame (10 ms) may be divided into 10 equally sized subframes (1 ms). Each subframe may include one or more time slots. Subframes may also include mini-slots, which may include 7, 4, or 2 symbols. In some examples, each slot may include 7 or 14 symbols, depending on the slot configuration.

For example, for slot configuration 0, each slot may include 14 symbols, and for slot configuration 1, each slot may include 7 symbols. The symbols on DL may be cyclic prefix (CP) OFDM (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission).

The number of slots within a subframe is based on the slot configuration and the numerology. For slot configuration 0, different numerologies ($\mu$) 0 to 5 allow for 1, 2, 4, 8, 16, and 32 slots, respectively, per subframe. For slot configuration 1, different numerologies 0 to 2 allow for 2, 4, and 8 slots, respectively, per subframe. Accordingly, for slot configuration 0 and numerology μ, there are 14 symbols/slot and 2μ slots/subframe. The subcarrier spacing and symbol length/duration are a function of the numerology. The subcarrier spacing may be equal to $2^\mu \times 15$ kHz, where μ is the numerology 0 to 5. As such, the numerology μ=0 has a subcarrier spacing of 15 kHz and the numerology μ=5 has a subcarrier spacing of 480 kHz. The symbol length/duration is inversely related to the subcarrier spacing. FIGS. 3A, 3B, 3C, and 3D provide an example of slot configuration 0 with 14 symbols per slot and numerology μ=2 with 4 slots per subframe. The slot duration is 0.25 ms, the subcarrier spacing is 60 kHz, and the symbol duration is approximately 16.67 μs.

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 3A, some of the REs carry reference (pilot) signals (RS) for a UE (e.g., UE 104 of FIGS. 1 and 2). The RS may include demodulation RS (DM-RS) (indicated as Rx for one particular configuration, where 100× is the port number, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 3B illustrates an example of various DL channels within a subframe of a frame. The physical downlink control channel (PDCCH) carries DCI within one or more control channel elements (CCEs), each CCE including nine RE groups (REGs), each REG including four consecutive REs in an OFDM symbol.

A primary synchronization signal (PSS) may be within symbol 2 of particular subframes of a frame. The PSS is used by a UE (e.g., 104 of FIGS. 1 and 2) to determine subframe/symbol timing and a physical layer identity.

A secondary synchronization signal (SSS) may be within symbol 4 of particular subframes of a frame. The SSS is used by a UE to determine a physical layer cell identity group number and radio frame timing.

Based on the physical layer identity and the physical layer cell identity group number, the UE can determine a physical cell identifier (PCI). Based on the PCI, the UE can determine the locations of the aforementioned DM-RS. The physical broadcast channel (PBCH), which carries a master information block (MIB), may be logically grouped with the PSS and SSS to form a synchronization signal (SS)/PBCH block. The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 3C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 3D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

ADDITIONAL CONSIDERATIONS

The preceding description provides examples of configuring sidelink slots with multiple automatic gain control symbols in communication systems. The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the generic principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The techniques described herein may be used for various wireless communication technologies, such as 5G (e.g., 5G NR), 3GPP Long Term Evolution (LTE), LTE-Advanced (LTE-A), code division multiple access (CDMA), time division multiple access (TDMA), frequency division multiple access (FDMA), orthogonal frequency division multiple access (OFDMA), single-carrier frequency division multiple access (SC-FDMA), time division synchronous code division multiple access (TD-SCDMA), and other networks. The terms "network" and "system" are often used interchangeably. A CDMA network may implement a radio technology such as Universal Terrestrial Radio Access (UTRA), cdma2000, and others. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, and others. UTRA and E-UTRA are part of Universal Mobile Telecommunication System (UMTS). LTE and LTE-A are releases of UMTS that use E-UTRA. UTRA, E-UTRA, UMTS, LTE, LTE-A and GSM are described in documents from an organization named "3rd Generation Partnership Project"

(3GPP). cdma2000 and UMB are described in documents from an organization named "3rd Generation Partnership Project 2" (3GPP2). NR is an emerging wireless communications technology under development.

The various illustrative logical blocks, modules and circuits described in connection with the present disclosure may be implemented or performed with a general purpose processor, a DSP, an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, a system on a chip (SoC), or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user equipment (as in the example UE 104 of FIG. 1), a user interface (e.g., keypad, display, mouse, joystick, touchscreen, biometric sensor, proximity sensor, light emitting element, and others) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method for wireless communication by a first user equipment (UE), comprising:
    enabling a slot configuration of a slot, wherein the slot configuration comprises at least two automatic gain control symbols configured for use for automatic gain control in preconfigured symbol locations within the slot, wherein the at least two automatic gain control symbols comprise a first automatic gain control symbol and a second automatic gain control symbol, wherein the first automatic gain control symbol is a first symbol within the slot and a symbol location of the second automatic gain control symbol within the slot is configured for receiving a transmission from a second UE that is an interference transmission of a sidelink transmission from the second UE, and wherein the sidelink transmission from the second UE is intended for a third UE;
    receiving the at least two automatic gain control symbols while receiving automatic gain control symbols within the slot; and
    adjusting an automatic gain control setting after receiving each automatic gain control symbol of the at least two automatic gain control symbols configured for use for automatic gain control.

2. The method of claim 1, wherein the slot configuration is associated with a resource pool configuration in which all slot configurations associated with the resource pool configuration include the at least two automatic gain control symbols configured for use by a receiver for automatic gain control in the preconfigured symbol locations.

3. The method of claim 2, further comprising receiving the resource pool configuration from a base station.

4. The method of claim 1, wherein the slot configuration comprises at least two mini-slots within the slot.

5. The method of claim 4, wherein each mini-slot of the at least two mini-slots comprises one automatic gain control symbol of the at least two automatic gain control symbols configured for use for automatic gain control as a first symbol in the mini-slot.

6. The method of claim 5, wherein each mini-slot of the at least two mini-slots is separated by at least one gap symbol within the slot.

7. The method of claim 1, wherein the slot is a sidelink slot.

8. A first user equipment (UE) configured for wireless communication, comprising:
    a memory comprising instructions; and
    one or more processors configured to execute the instructions and cause the first UE to:
        enable a slot configuration of a slot, wherein the slot configuration comprises at least two automatic gain control symbols configured for use for automatic gain control in preconfigured symbol locations within the slot, wherein the at least two automatic gain control symbols comprise a first automatic gain control symbol and a second automatic gain control symbol, wherein the first automatic gain control symbol is a first symbol within the slot and a symbol location of the second automatic gain control symbol within the slot is configured for receiving a transmission from a second UE that is an interference transmission of a sidelink transmission from the second UE, and wherein the sidelink transmission from the second UE is intended for a third UE;
        receive the at least two automatic gain control symbols while receiving automatic gain control symbols within the slot; and
        adjust an automatic gain control setting after receiving each automatic gain control symbol of the at least two automatic gain control symbols configured for use for automatic gain control.

9. The first UE of claim 8, wherein the slot configuration is associated with a resource pool configuration in which all slot configurations associated with the resource pool configuration include the at least two automatic gain control symbols configured for use by a receiver for automatic gain control in the preconfigured symbol locations.

10. The first UE of claim 9, wherein the one or more processors are configured to execute the instructions and further cause the first UE to receive the resource pool configuration from a base station.

11. The first UE of claim 8, wherein the slot configuration comprises at least two mini-slots within the slot.

12. The first UE of claim 11, wherein each mini-slot of the at least two mini-slots comprises one automatic gain control symbol of the at least two automatic gain control symbols configured for use for automatic gain control as a first symbol in the mini-slot.

13. The first UE of claim 12, wherein each mini-slot of the at least two mini-slots is separated by at least one gap symbol within the slot.

14. The first UE of claim 8, wherein the slot is a sidelink slot.

15. A non-transitory computer-readable medium comprising computer-executable instructions that, when executed by one or more processors of a first user equipment (UE), cause the first UE to perform a method of wireless communication, comprising:
    enabling a slot configuration of a slot, wherein the slot configuration comprises at least two automatic gain control symbols configured for use for automatic gain control in preconfigured symbol locations within the slot, wherein the at least two automatic gain control symbols comprise a first automatic gain control symbol and a second automatic gain control symbol, wherein the first automatic gain control symbol is a first symbol within the slot and a symbol location of the second automatic gain control symbol within the slot is configured for receiving a transmission from a second UE that is an interference transmission of a sidelink transmission from the second UE, and wherein the sidelink transmission from the second UE is intended for a third UE;

receiving the at least two automatic gain control symbols while receiving automatic gain control symbols within the slot; and adjusting an automatic gain control setting after receiving each automatic gain control symbol of the at least two automatic gain control symbols configured for use for automatic gain control.

16. The non-transitory computer-readable medium of claim 15, wherein the slot configuration is associated with a resource pool configuration in which all slot configurations associated with the resource pool configuration include the at least two automatic gain control symbols configured for use by a receiver for automatic gain control in the preconfigured symbol locations.

17. The non-transitory computer-readable medium of claim 16, wherein the method further comprises receiving the resource pool configuration from a base station.

18. The non-transitory computer-readable medium of claim 15, wherein the slot configuration comprises at least two mini-slots within the slot.

19. The non-transitory computer-readable medium of claim 18, wherein each mini-slot of the at least two mini-slots comprises one automatic gain control symbol of the at least two automatic gain control symbols configured for use for automatic gain control as a first symbol in the mini-slot.

20. The non-transitory computer-readable medium of claim 19, wherein each mini-slot of the at least two mini-slots is separated by at least one gap symbol within the slot.

21. The non-transitory computer-readable medium of claim 15, wherein the slot is a sidelink slot.

22. A first user equipment (UE) configured for wireless communication, comprising:

means for enabling a slot configuration of a slot, wherein the slot configuration comprises at least two automatic gain control symbols configured for use for automatic gain control in preconfigured symbol locations within the slot, wherein the at least two automatic gain control symbols comprise a first automatic gain control symbol and a second automatic gain control symbol, wherein the first automatic gain control symbol is a first symbol within the slot and a symbol location of the second automatic gain control symbol within the slot is configured for receiving a transmission from a second UE that is an interference transmission of a sidelink transmission from the second UE, and wherein the sidelink transmission from the second UE is intended for a third UE;

means for receiving the at least two automatic gain control symbols while receiving automatic gain control symbols within the slot; and means for adjusting an automatic gain control setting after receiving each automatic gain control symbol of the at least two automatic gain control symbols configured for use for automatic gain control.

23. The first UE of claim 22, wherein the slot configuration is associated with a resource pool configuration in which all slot configurations associated with the resource pool configuration include the at least two automatic gain control symbols configured for use by a receiver for automatic gain control in the preconfigured symbol locations.

24. The first UE of claim 23, further comprising means for receiving the resource pool configuration from a base station.

25. The first UE of claim 22, wherein the slot configuration comprises at least two mini-slots within the slot.

26. The first UE of claim 25, wherein each mini-slot of the at least two mini-slots comprises one automatic gain control symbol of the at least two automatic gain control symbols configured for use by a receiver for automatic gain control as a first symbol in the mini-slot.

27. The first UE of claim 26, wherein each mini-slot of the at least two mini-slots is separated by at least one gap symbol within the slot.

28. The first UE of claim 22, wherein the slot is a sidelink slot.

* * * * *